United States Patent
Alden, 3rd et al.

(10) Patent No.: US 6,280,202 B1
(45) Date of Patent: Aug. 28, 2001

(54) BOARD-TO-BOARD ALIGNMENT AND SECUREMENT DEVICE

(75) Inventors: Wayne S. Alden, 3rd, Whitman; William Petrocelli, Douglas, both of MA (US)

(73) Assignee: Thomas & Betts International, Inc., Sparks, NV (US)

(*) Notice: Subject to any disclaimer, the term of this patent is extended or adjusted under 35 U.S.C. 154(b) by 0 days.

(21) Appl. No.: 09/387,885

(22) Filed: Sep. 1, 1999

(51) Int. Cl.$^7$ ................................................ H01R 12/00
(52) U.S. Cl. ......................... 439/66; 439/74; 439/91; 439/591; 439/573; 411/389; 174/138 D; 361/804
(58) Field of Search ........................... 439/44, 65, 66, 439/86, 91, 74, 573, 591; 361/804; 174/138 D; 411/388, 389, 178

(56) References Cited

U.S. PATENT DOCUMENTS

| | | |
|---|---|---|
| D. 293,880 | 1/1988 | Takahashi . |
| 1,864,080 * | 6/1932 | Madge .................................. 411/389 |
| 3,356,904 | 12/1967 | Yonkers . |
| 4,309,856 | 1/1982 | Varnau et al. . |
| 4,640,639 * | 2/1987 | Matsui ............................. 174/138 D |
| 4,760,495 | 7/1988 | Till . |
| 4,855,873 * | 8/1989 | Bhargava et al. ................ 174/138 D |
| 4,875,140 * | 10/1989 | Delpech et al. .................. 174/138 D |
| 4,969,065 * | 11/1990 | Petri ................................. 174/138 D |
| 5,473,510 * | 12/1995 | Dozier, II ................................. 439/66 |
| 5,608,611 | 3/1997 | Szudarek et al. . |
| 5,703,753 | 12/1997 | Mok . |
| 5,715,141 | 2/1998 | Karlsson . |
| 5,721,671 | 2/1998 | Ruque . |

* cited by examiner

*Primary Examiner*—Tho D. Ta
(74) *Attorney, Agent, or Firm*—Hoffman & Baron, LLP (57) ABSTRACT

An improved securement device aligns adjacent printed circuit boards ("PCBs") while simultaneously connecting all external hardware so as to prevent overcompression of elastomeric contacts positioned therebetween during assembly. The device supports a connector between a pair of PCBs in spaced parallel relation, wherein the connector itself supports a plurality of elastomeric contacts thereon for establishing electrical engagement between the PCBs. The PCBs and the connector each include aligned securement openings. The device includes an elongate fastener having a substantially cylindrical section positioned in the connector opening. The cylindrical section defines a pair of opposed, substantially planar spaced apart component landings for support of a similarly planar component thereupon. The landings are spaced apart a distance sufficient to place the PCBs in communication with the connector without overcompressing the elastomeric contacts therebetween. A substantially annular shoulder is concentrically defined on each of the landings and extends longitudinally therefrom. Such shoulder has an outer diameter smaller than an outer diameter of said cylindrical section. Further, a fastening element extends longitudinally from at least one of said top and bottom shoulders for fastening of the securement element to a housing member accommodating the PCBs and connector therein. In a preferred embodiment, a diametrical slotted cavity is defined in one landing and shoulder, which accommodates a torquing element therein. The slotted cavity provides access to an internally threaded bore which is defined along the length of the slot and can be defined along the longitudinal extent of the cylindrical section itself.

13 Claims, 7 Drawing Sheets

BOARD-TO-BOARD ALIGNMENT AND SECUREMENT DEVICE

FIELD OF THE INVENTION

The present invention relates generally to devices for alignment and connection of planar electronic components such as printed circuit boards. More particularly, the present invention relates to an improved board-to-board securement device for successful alignment and connection of adjacent, planar components in spaced parallel relation in an electronic device or system so as to prevent overcompression of elastomeric contact elements positioned therebetween.

BACKGROUND OF THE INVENTION

Electronic devices and systems are integral facets of every industry and profession. The evolution of electronics allows for the integration of more electronic circuits in a wide variety of equipment. Concurrently with the rapid growth of certain electronic hardware such as cellular and other portable communications devices, laptop and notebook computers, home and office Internet access equipment, there has been a demand on reducing the various IC packaging schemes. Connector manufacturers have had to scale down connectors to fit these miniaturized products. Reliable miniaturization, therefore, is a significant factor in connector design.

One of the challenges for system designers has been to provide an interconnection path for densely integrated silicon devices onto a motherboard. One of the barriers to integrating even more functions into a single chip has been the input/output ("I/O") limitations of conventional interconnect technology.

A modern solution developed to overcome the problems inherent in establishing and maintaining aligned connections between electronic components is the use of metallized particle interconnect ("MPI") contacts. MPI contacts are elastomeric contacts which integrate semi-conductive material therein. The MPI contacts are designed to provide an electrically and mechanically reliable, low-cost interconnection method for high-density printed circuit board ("PCB") components without the use of metal pins or solder techniques. The conductive path has similar electrical properties to a metal pin or solder contact.

The MPI material, an elastomeric material with semiconductive particles dispersed therein, is formed into tiny micro columns and held in a grid pattern by a thin polyamide substrate which aligns with the lands of a packaged silicon device and the landing pad of the PCB. When mechanically compressed, the micro columns align with the pads on an LGA package and the landing pads of a PCB, forming a conductive path therebetween. The flexible polymer/metallization columns act as shock absorbers allowing for excellent performance under extreme shock/vibration testing. Also, the elasticity of the polymeric column acts as a seal to the environment at the point of connection, protecting the connection from harmful elements.

MPI technology is seen as a solution to integrating high-density microprocessors and other silicon devices onto the motherboard, both in terms of I/O count as well as the potential for far lower costs than other interconnections. The MPI technology has the potential to double or even triple the upper limit for I/O. With a higher density interconnection technology such as this, designers will be able to integrate the functions of several chips into a single piece of silicon, thereby reducing the number of components, interconnections and overall size of the PCBs. At a low cost per contact with an integral heat sink, and exceptionally low tooling costs, MPI has great potential to replace most of the interconnects in PCS, laptops and other electronic devices.

MPI contacts are not only desirable because of their superior mechanical, electrical and thermal performance, but also because of the cost per contact is significantly lower than mechanically complex cartridge-type interconnects or conventional board-to-board, metal pin-and-socket or BGA devices. The MPI material's polymer/metallization combination also provides superior resistance to environmental and shock/vibration conditions as well as excellent conductive performance, both electrically and thermally.

The problem remains, however, of alignment and connection of planar components such as PCBs to one another to maintain interconnection therebetween. As pin counts continue to increase with the advent of MPI and related technologies, it becomes increasingly important to achieve and maintain alignment of adjacent elements in an electronic device or system to prevent vibrations therein which may negatively affect the proper operation of such elements and the system as a whole.

Devices for securement of planar elements such as those utilized in electronic components are well-known and widely employed. In conventional connectors, a locating pin is mounted on a connector that protrudes above and below the connector. The locating pin aligns the connector to a pair of planar elements such as a motherboard and daughtercard by holes located in the boards just for this purpose. Examples of such connectors include U.S. Pat. No. 4,309,856 to Varnau et al. which discloses a resilient device for securing panels in parallel spaced relation to a support bracket; U.S. Pat. No. 4,760,495 to Till, which provides a "stand-off device" to control the spacing between adjacent planar elements in electronic instrumentation; and U.S. Pat. No. 4,875,140 to Delpech which discloses a support device for printed circuit boards formed by a column having at least one base on which a circuit board is to be supported with the boards and a coupling member fixed by a screw.

One problem inherent in traditional electronic connectors such as these is that such elements require additional fastening hardware to join the assembly of connector and boards together. Additional holes must therefore be provided in the PCB, decreasing the are available for routing circuitry and consequently increasing the difficulty of board design. Moreover, the above devices permit excessive compression of contacts, between the planar elements, negating proper performance of the contacts and obviating the beneficial results of the alignment operation. This is of particular concern with electronic contacts. Thus, additional hardware is required to prevent overcompression of the contacts. Such obstacles to circuitry routing contribute significantly to higher board costs.

Accordingly, it is an object of the present invention to provide a unitary securement member that provides alignment of adjacent planar components in a spaced parallel relation and furthermore prevents overcompression of contacts therebetween.

SUMMARY OF THE INVENTION

It is an object of the present invention to provide an improved alignment and securement device for planar elements in a system of electronic components.

It is another object of the present invention to provide a securement device for adjacent planar elements which ensures alignment of the elements in spaced parallel relation.

It is yet another object of the present invention to provide a securement device which achieves alignment of planar elements while preventing overcompression of electrical contacts therebetween.

It is a further object of the present invention to reduce the number of apertures for fastening hardware through planar components, thereby increasing the area available to route circuitry thereon.

In the efficient attainment of these and other objects, the present invention provides a securement device to align adjacent printed circuit boards, such as a motherboard and daughtercard (collectively "PCBs"), while simultaneously connecting all external hardware so as to prevent overcompression of elastomeric contacts positioned therebetween during assembly. The device supports a connector between a pair of PCBs in spaced parallel relation, wherein the connector itself supports a plurality of elastomeric contacts thereon for establishing electrical engagement between the PCBs. The PCBs and the connector each include aligned securement openings.

The device includes an elongate fastener having a substantially cylindrical section positioned in the connector opening. The cylindrical section defines a pair of opposed, substantially planar spaced apart component landings for support of a planar component such as a PCB thereupon. The landings are spaced apart a distance sufficient to place the PCBs in electrical engagement with the connector without overcompressing the elastomeric contacts therebetween. A substantially annular shoulder is concentrically defined on each of the landings and extends longitudinally therefrom. Such shoulder has an outer diameter smaller than an outer diameter of said cylindrical section. Further, a fastening element extends longitudinally from at least one of said top and bottom shoulders for fastening of the securement element to a housing member accommodating the PCBs and connector therein.

In a preferred embodiment, a diametrical slotted cavity is defined in one landing and shoulder which accommodates a torquing element therein. The slotted cavity provides access to an internally threaded bore which is defined along the length of the slot and can be defined along the longitudinal extent of the cylindrical section itself.

DETAILED DESCRIPTION OF THE PREFERRED EMBODIMENTS

Figure 1:
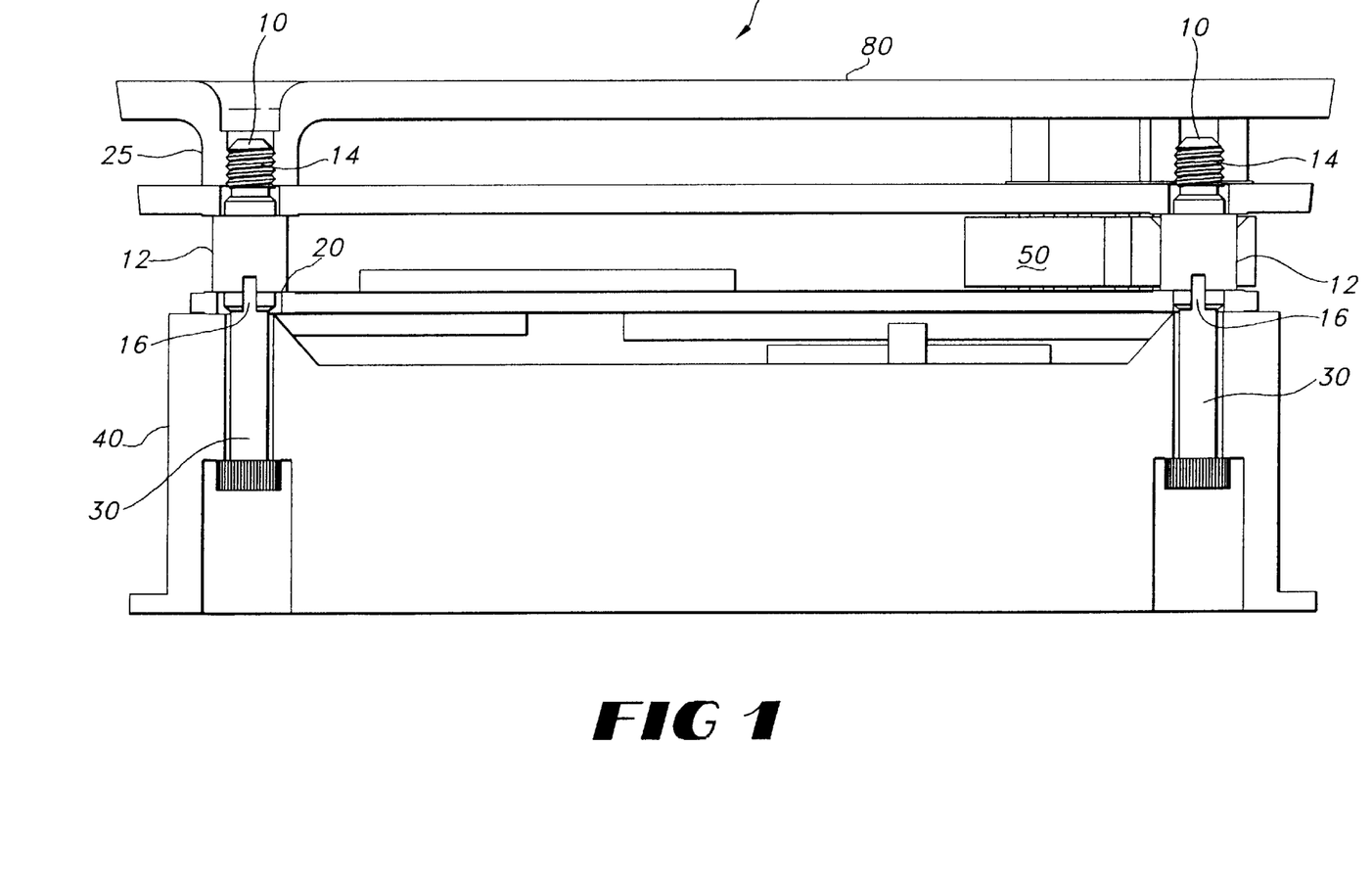
FIG. 1 is a schematic representation of an electronic system utilizing an alignment and securement device of the present invention.

Referring to the drawings, in which like elements are identically numbered, FIG. 1 shows an assembly 1 of electronic components utilizing an alignment and securement device 10. Securement device 10 is a substantially cylindrical, internally threaded member adapted for insertion between planar components, such as motherboard 60 and daughtercard 70 (collectively "boards"). Securement device 10 secures such boards to one another so as to accommodate placement of an interconnection device therebetween, such as MPI connector 50. A heatsink or heat spreader plate 40 can also be incorporated into the assembly to provide additional support and dissipate excess heat.

Figure 2:
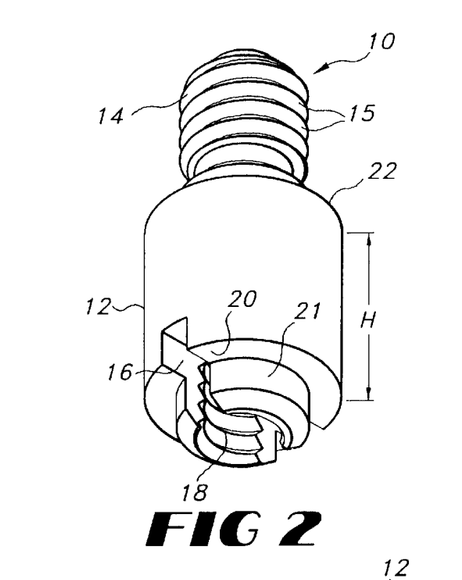
FIG. 2 shows a perspective view of a preferred embodiment of the alignment and securement device of the present invention.
Figures 2A, 2B:
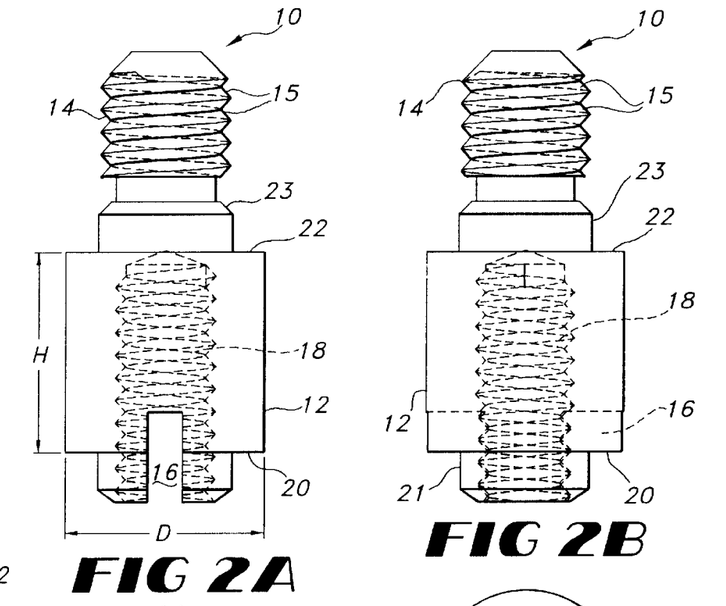
FIGS. 2A, 2B, 2C and 2D show a vertical side view, an alternative vertical side view, a horizontal side view and a bottom view, respectively, of the securement device of FIG. 2.
Figure 2C:
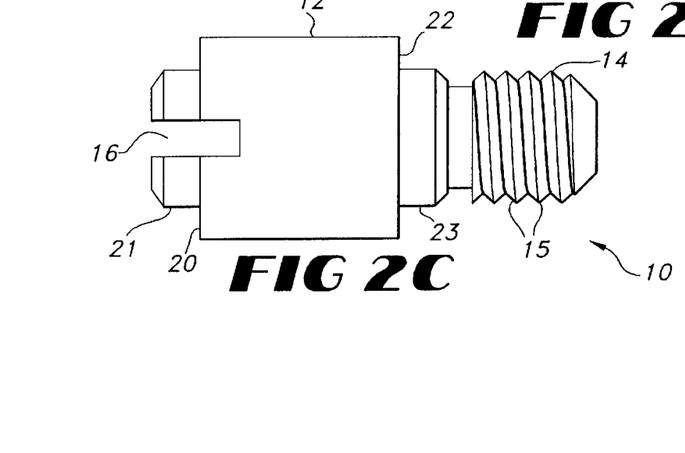
Figure 2D:
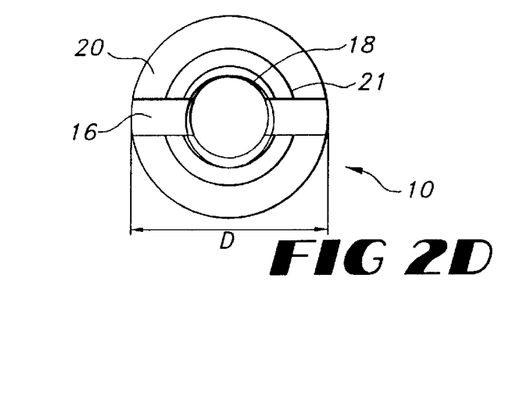

As more readily seen in FIGS. 2 and 2A, a preferred embodiment of the securement device 10 is an elongate member including a substantially cylindrical section 12 having a predetermined height H and a large outer diameter D. As particularly shown in FIG. 2, Section 12 has a bottom extremity defined by a substantially planar landing 20 forming an annular platform adjacent cylindrical section 12. Landing 20 has a small, generally annular shoulder 21 protruded longitudinally therefrom which is concentrically defined thereon. Section 12 also includes a top extremity defined by a substantially planar landing 22 forming an annular platform at an opposing portion of cylindrical section 12 . Landing 22 also has a small, generally annular shoulder 23 protruding longitudinally therefrom and concentrically defined thereon.

Referring further to FIGS. 2A–2D, a diametrical slotted cavity 16 is provided in shoulder 21. Slotted cavity 16 has a predetermined width and depth defined in cylindrical section 12 to accommodate insertion of a torque member therein, such as a straight edge screwdriver. Slotted cavity 16 provides access to an internally threaded bore 18 by a fastening member, such as a fastening screw having a threaded configuration corresponding to that of bore 18. Tapping of threaded bore 18 can extend well into the interior of section 12 and may span height H thereof.

A fastening element 14 depends from the top extremity of cylindrical section 12. Fastening element 14 is shown herein as an external male threaded element having a plurality of threads 15 defined thereon. Fastening element 14 has a length and diameter sufficient to threadably engage a housing 80 so as to securely fasten planar components therewithin. Although fastening element 14 is shown as a helical thread, it is understood that it may comprise any other fastening element conducive to the function of the present invention, such as a nut and bolt combination.

Having described the components, the operation and function of the present invention connector can now be described, with reference to FIGS. 3 and 4.

Figure 3:
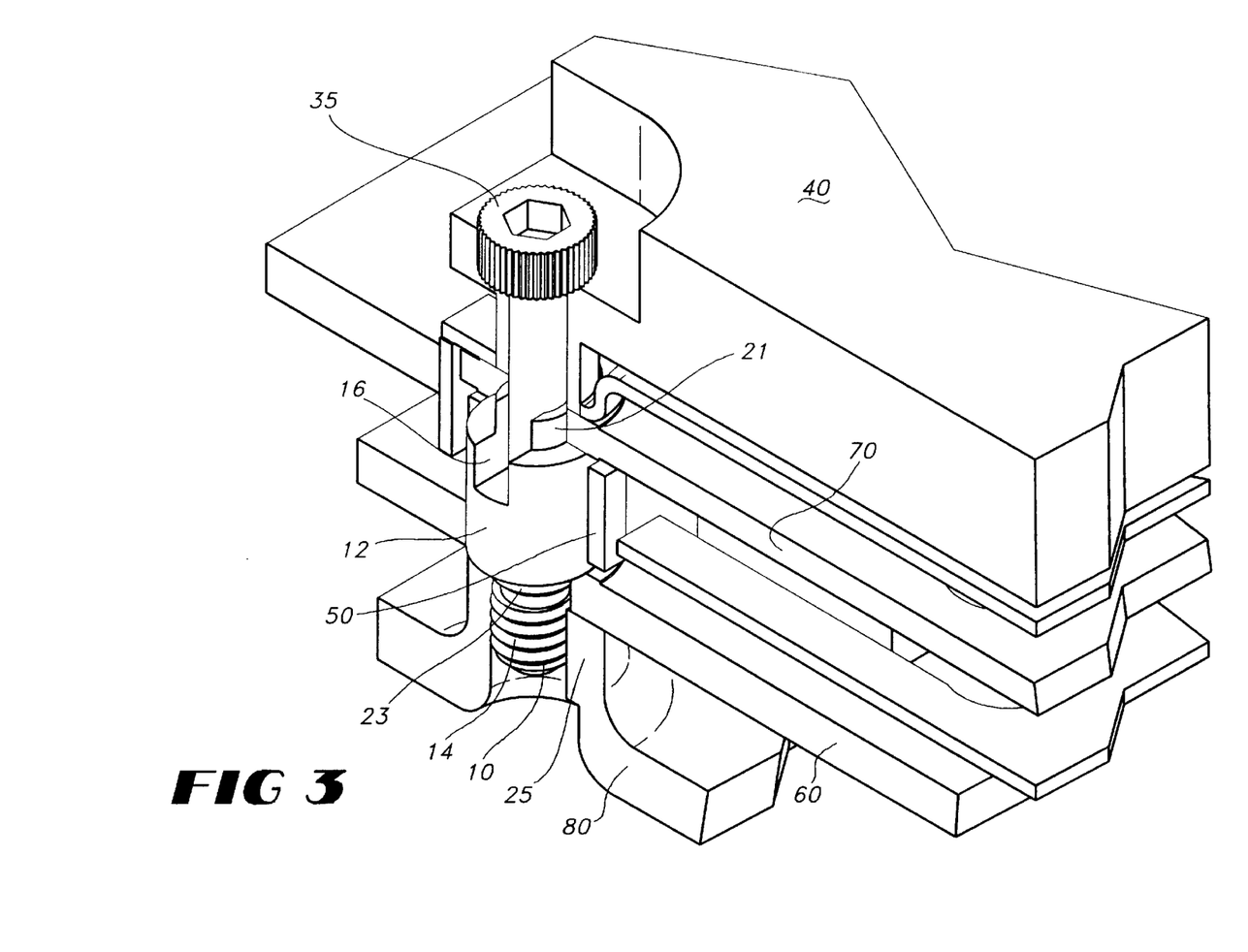
FIG. 3 is a partial perspective view of an electronic assembly utilizing the securement device of FIG. 2.

Securement device 10 is insertably aligned in an electronic assembly 1 such as that shown in FIG. 3. Motherboard 60 and daughtercard 70 are placed in spaced parallel relation so as to be in alignment with one another 70. A support or bolster plate 80 may be inserted adjacent motherboard 60 and atop plastic case 30 to provide additional compression and support of the electronic assembly.

Securement device 10 is inserted into the assembly such that top shoulder 23 is insertably accommodated in a corresponding aperture in motherboard 60 (not shown). Cylindrical section 12 resides in a corresponding aperture provided in connector 50, such aperture being in alignment with the aperture in motherboard 60. Fastening element 14 engages (and in this case, is threadably secured to) support plate 80, the support plate providing a threaded orifice corresponding to fastening element 14. The external threads 15 are then screwed in to support plate 80 located directly beneath the connector area and further into threaded bosses on plastic case 30 located there beneath. In this manner, the support plate and fastening element can be secured to one another to effect securement and alignment of support plate 80 to motherboard 60.

MPI connector 50 is placed alongside cylindrical section 12 such that a plurality of resilient elements 55 supported by connector 50 are in mechanical and electrical engagement with the boards 60 and 70. Landing 22 compresses motherboard 60 therebeneath, and landing 20 supports daughtercard 70 thereon. The large outside diameter of cylindrical section 12, in combination with shoulders 21 and 23, ensures securement of the connector to both boards, thereby minimizing any tolerance stack-up usually associated with multiple component assemblies and preventing the user from overcompressing contacts 55.

Figure 4:
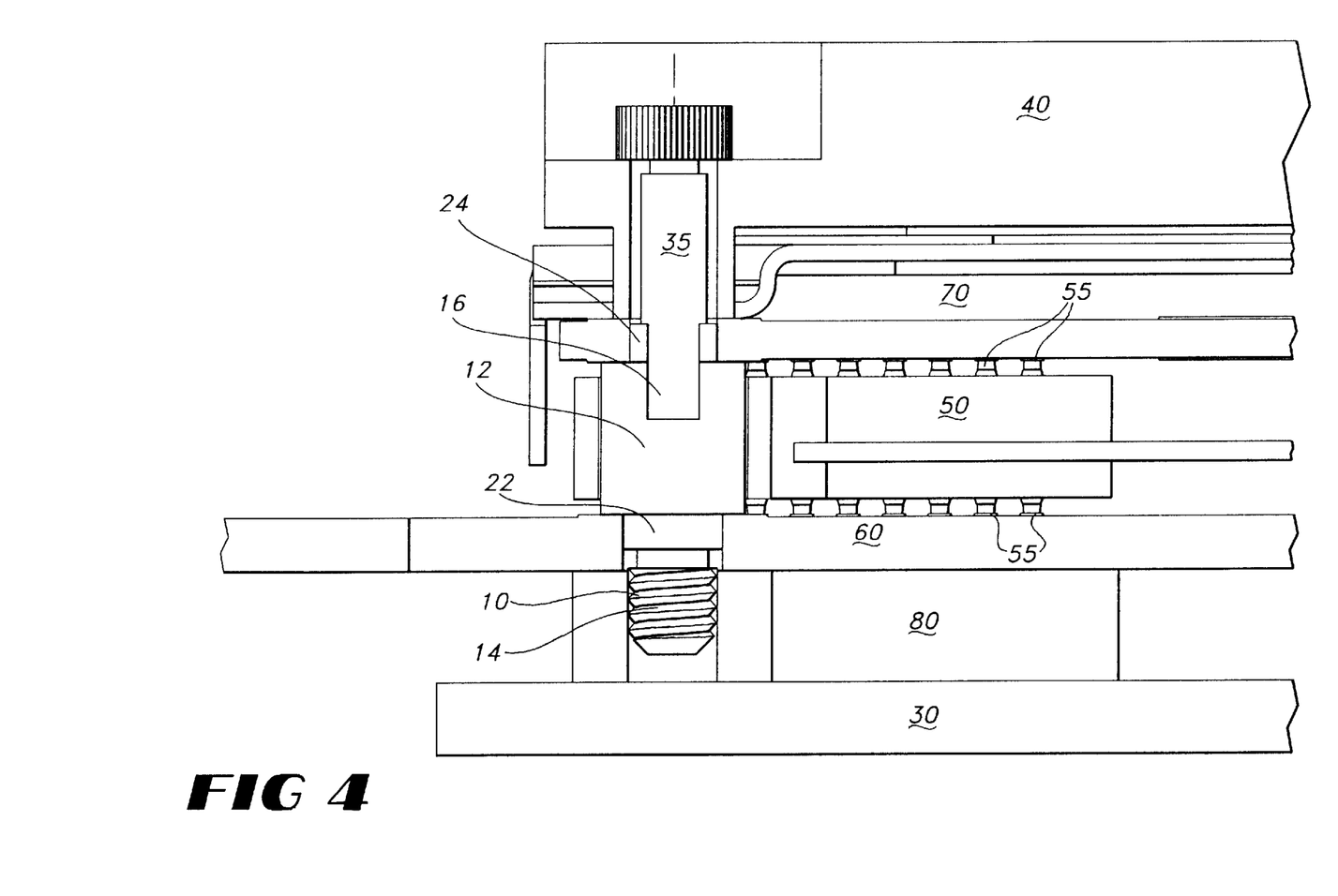
FIG. 4 is a partial side view of the electronic assembly of FIG. 3 utilizing the securement device of FIG. 2.

As illustrated more fully in FIG. 4, MPI connector 50 supports a plurality of MPI contacts 55 thereon. Each of electrical contacts 55 is made from an electrically conductive material of the type fabricated from a high temperature flexible conductive polymer having medalist particles embedded therein. Such a layer may be made from the combination of an elastic insulative polymeric material and a conductive material, such as a plurality of conductive flakes, as disclosed in commonly assigned U.S. Pat. No. 5,871,842 and incorporated by reference herein. Specifically, a layered composition comprising a substrate and a thermoplastic elastomer barrier layer may be provided. The substrate may be fabricated from an elastic material such as silicone rubber, a flexible material such as the thermoplastic polyamide ("Nylon") or a rigid material such as thermoplastic polyamide-imide ("Ultem"). The barrier layer may be fabricated of a thermoplastic elastomer such as a thermoplastic polyurethane elastomer or a thermoplastic polyolefin elastomer. The conductive flakes may be fabricated of a conductive or semiconductive material such as silver, nickel or carbon. The size of the flakes varies with the level of conductivity required for a particular application, and particularly with respect to establishment of a sufficient electrical connection between the elastomeric element and a chip card in contact therewith.

Daughtercard 70 is then placed overlying elastomeric elements 55 such that the daughtercard engages shoulder 20. This small shoulder located on the top of internally threaded bore 18 aligns with a hole in the daughtercard (not shown.) Securement device 10 is thereafter torqued by a tool (i.e. standard screwdriver) inserted into diametrical slotted cavity 16 designated for this purpose. Because securement device 10 is a turned screw machined part, positional tolerances can be held very tightly.

Heatsink plate 40 is then placed in overlying alignment with daughtercard 70, and the entire assembly is fastened by a securement element such as fastening screw 35. Fastening screw 35 is insertable through heatsink plate 40 and directly infiltrates threaded bore 18 for securement therewith to provide additional securement of the assembly components.

Figures 5, 5A, 5B:
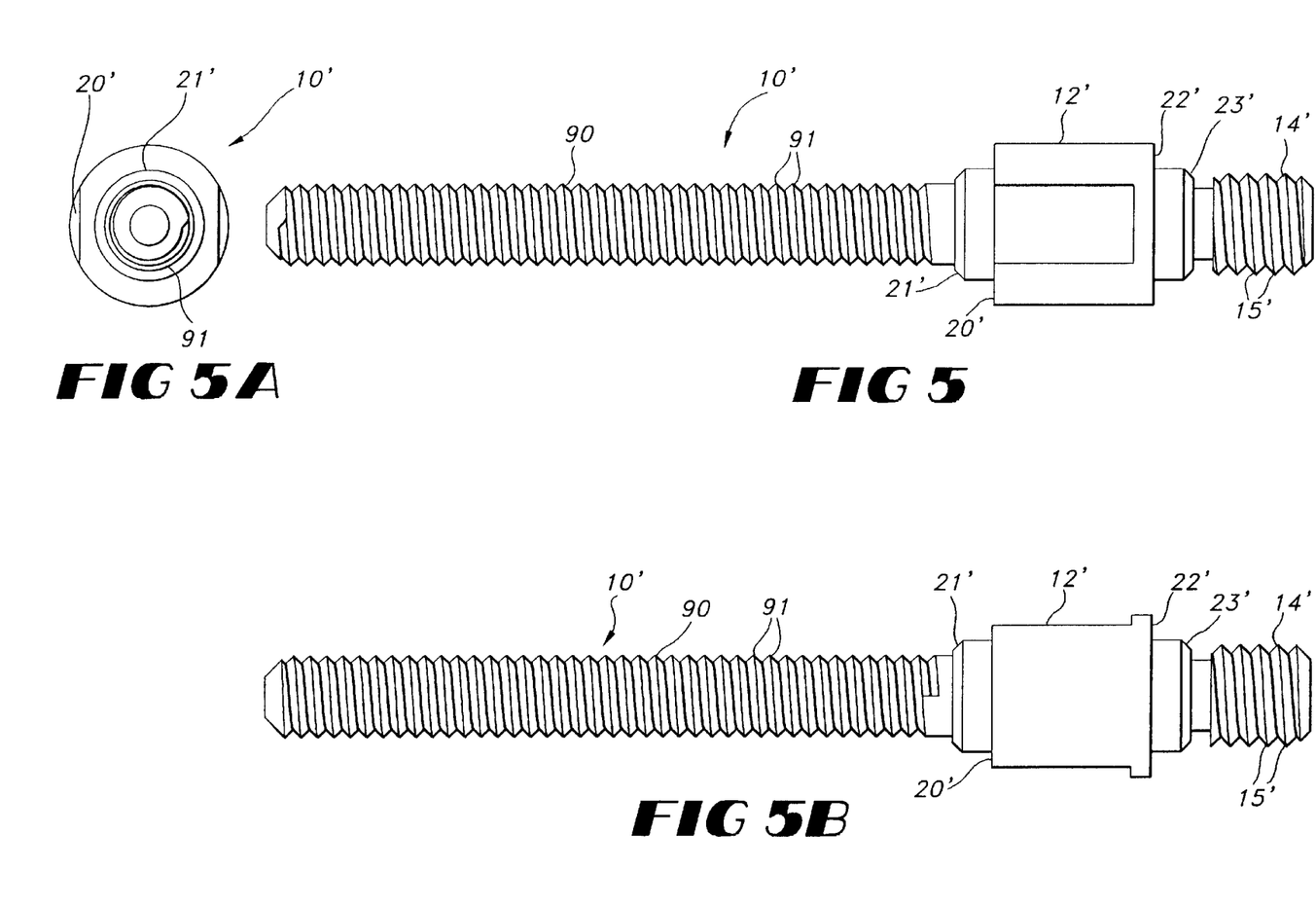
FIG. 5 is a side perspective view of an alternative preferred embodiment of the securement device of the present invention.
FIGS. 5A and 5B are a bottom view and a rotated side view, respectively, of the securement device of FIG. 5.

In an alternative preferred embodiment of the present invention, shown in FIG. 5, a securement device 10' is provided having similar features to those of securement device 10 described hereinabove. An elongate securement section 90, however extends laterally in relation to shoulder 21'. As further shown in FIGS. 5A and 5B, elongate securement section 90 is shown as an external male threaded element having a plurality of helical threads 91 thereon.

Figure 6:
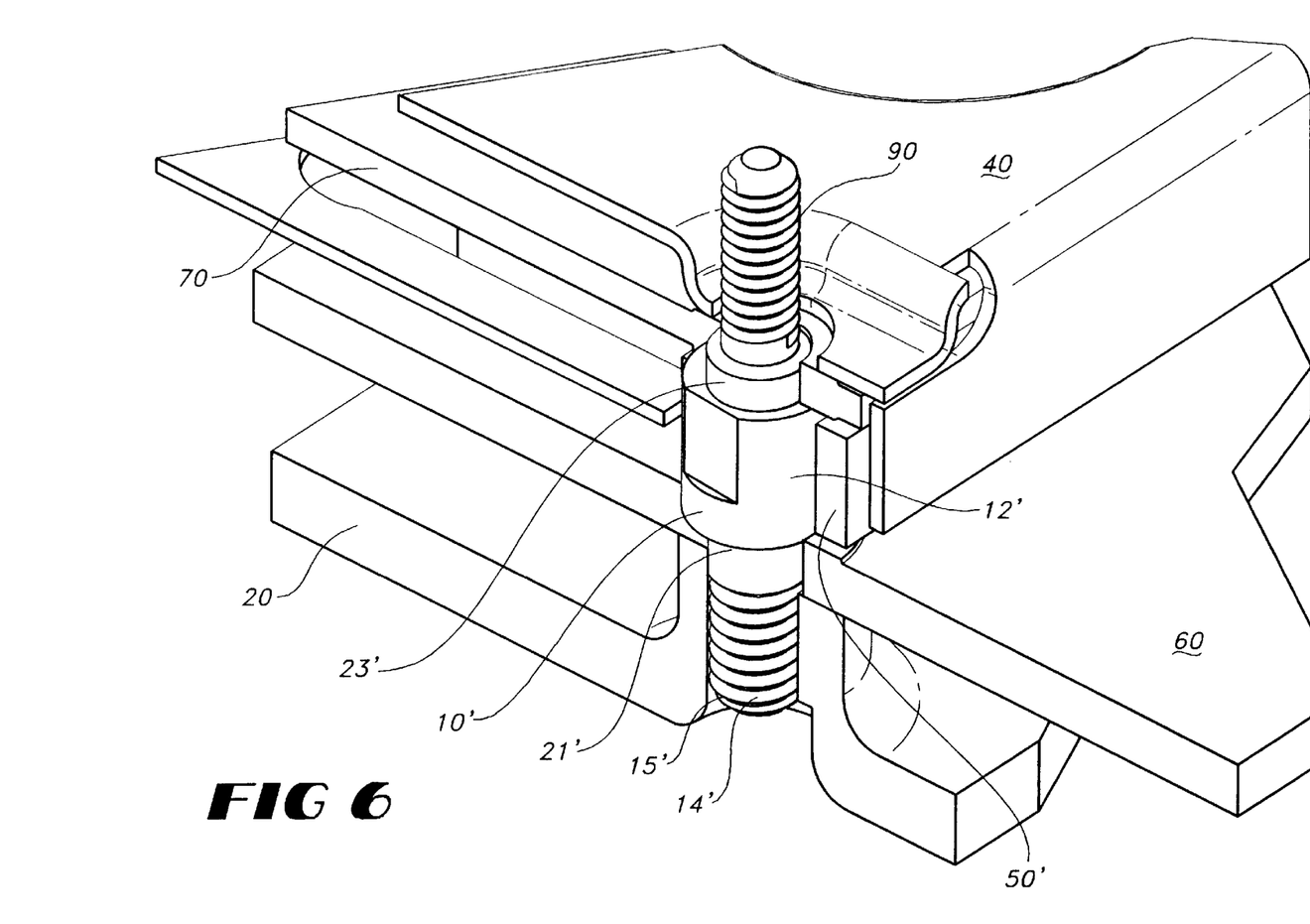
FIG. 6 is a partial perspective view of an electronic assembly utilizing the alignment securement device of FIG. 5.
Figure 7:
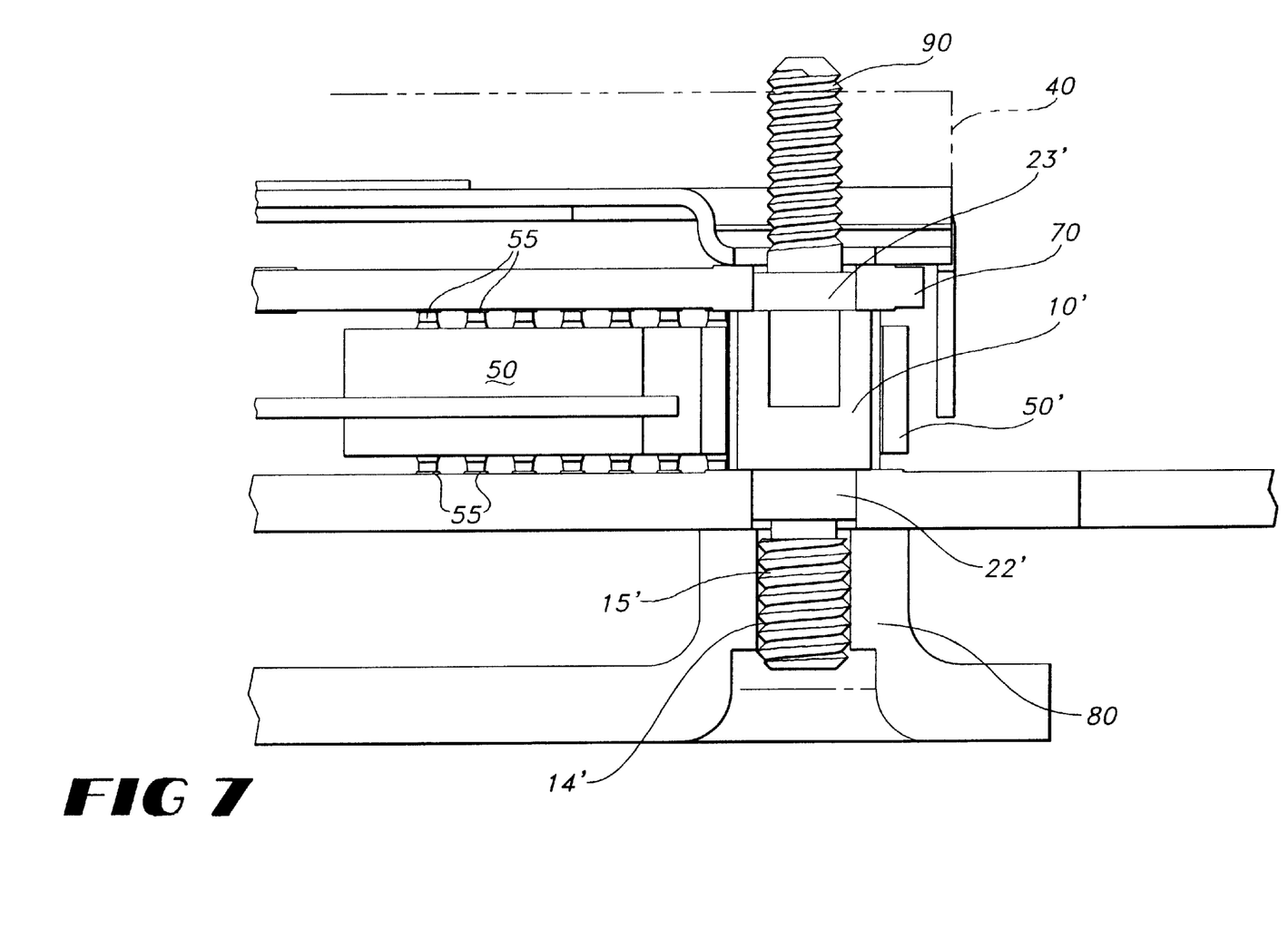
FIG. 7 is a partial side view of the electronic assembly of FIG. 6 utilizing the securement device of FIG. 5.

However, any fastening element conducive to the operation of the present invention may be used. Securement section 90 is long enough to protrude above the heatsink plate 40 and fasten using a nut and washer instead of a screw. The use of securement device 10' is similar to that of securement device 10, and its implementation in an electronic component system is illustrated fully in FIGS. 6 and 7.

The present invention obviates the requirement for extra openings in PCBs to accommodate fastening hardware by providing a device that threadably engages corresponding threaded portions and provides easy access for conventional fastening tools (i.e.. a screwdriver) to tighten the connector and thereby attain alignment of the boards. This invention further allows MPI contacts to be mounted and aligned using existing components to prevent overcompression of the contacts during assembly.

Various changes to the foregoing described and shown structures would now be evident to those skilled in the art. Accordingly, the particularly disclosed scope of the invention is set forth in the following claims.

What is claimed is:

1. A securement device for supporting an electrical connector between and in electrical engagement with a pair of printed circuit boards in spaced parallel relation, said securement device comprising:
   an elongate fastener having a substantially cylindrical section and defining a pair of opposed, substantially planar spaced apart component landings;
   a substantially annular shoulder substantially concentrically defined on each of said landings and extending longitudinally therefrom for insertion into a respective opening in each of said boards, said shoulders having an outer diameter smaller than an outer diameter of said cylindrical section; and
   a fastening element extending longitudinally from at least one of said shoulders for fastening said securement device to an external component;
   an internally threaded bore being defined in the other of said shoulders for threaded engagement with a similarly threaded securement element therein.

2. The securement device of claim 1 wherein said internally threaded bore is defined along an extent of said cylindrical section.

3. The securement device of claim 1 wherein said fastening element comprises an external male helical thread.

4. The securement device of claim 1 further comprising a diametrical slotted cavity defined in said other of said shoulders in communication with said threaded bore to accommodate insertion of said torque member therein.

5. The securement device of claim 4 wherein said slotted cavity has a predetermined depth in said cylindrical section to accommodate further insertion of said torque member therein.

6. An electrical interconnection assembly comprising:
   a pair of printed circuit boards positioned in substantially parallel spaced apart relation;
   an elastomeric connector interposed between said printed circuit boards, said elastomeric connector including a plurality of resilient electrical contacts, said contacts being in electrical connection with said printed circuit boards, said boards and connector each including aligned securement openings; and
   a securement device supporting said connector between said printed circuit boards, said securement device further including:

an elongate fastener having a substantially cylindrical section positioned in said connector opening and defining a pair of opposed, substantially planar spaced apart component landings;

a substantially annular shoulder substantially concentrically defined on each of said landings and extending longitudinally therefrom, each said shoulder having an outer diameter smaller than an outer diameter of said cylindrical section; and a fastening element extending longitudinally from at least one of said shoulders for fastening said securement element to an external component;

said landings being spaced apart a distance placing said boards in communication with said connector without overcompressing said resilient contacts therebetween.

7. The interconnection assembly of claim 6 wherein said fastening element comprises an external male helical thread.

8. The interconnection assembly of claim 6 wherein a substantially elongate securement section extends from the other of said shoulders.

9. The interconnection assembly of claim 6 wherein said securement device includes a diametrical slotted cavity defined in one of said shoulders to accommodate insertion of a torque member therein.

10. The interconnection assembly of claim 9 wherein said slotted cavity has a predetermined depth in said cylindrical section to accommodate further insertion of said torque member therein.

11. The interconnection assembly of claim 9 wherein an internally threaded bore is defined within said slotted cavity for threaded engagement with a similarly threaded securement element therein.

12. The interconnection assembly of claim 11 wherein said internally threaded bore is defined along an extent of said cylindrical section.

13. The interconnection assembly of claim 11 wherein said threaded securement element comprises a fastening screw for threaded engagement with said internal thread.

* * * * *